(12) United States Patent
Baggett et al.

(10) Patent No.: US 11,728,187 B2
(45) Date of Patent: Aug. 15, 2023

(54) METHOD FOR DECREASING COOL DOWN TIME WITH HEATED SYSTEM FOR SEMICONDUCTOR MANUFACTURING EQUIPMENT

(71) Applicant: Axcelis Technologies, Inc., Beverly, MA (US)

(72) Inventors: John Baggett, Amesbury, MA (US); Joseph Ferrara, Georgetown, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 1208 days.

(21) Appl. No.: 16/229,572

(22) Filed: Dec. 21, 2018

(65) Prior Publication Data

US 2020/0203196 A1 Jun. 25, 2020

(51) Int. Cl.
| | |
|---|---|
| *H01L 21/67* | (2006.01) |
| *C23C 16/458* | (2006.01) |
| *C23C 16/52* | (2006.01) |
| *H01L 21/683* | (2006.01) |
| *H01J 37/32* | (2006.01) |
| *H01L 21/265* | (2006.01) |
| *H01J 37/317* | (2006.01) |
| *C23C 16/44* | (2006.01) |

(52) U.S. Cl.
CPC .... *H01L 21/67098* (2013.01); *C23C 16/4412* (2013.01); *C23C 16/4586* (2013.01); *C23C 16/52* (2013.01); *H01J 37/3171* (2013.01); *H01J 37/32724* (2013.01); *H01L 21/265* (2013.01); *H01L 21/67248* (2013.01); *H01L 21/6833* (2013.01)

(58) Field of Classification Search
None
See application file for complete search history.

(56) References Cited

U.S. PATENT DOCUMENTS

| | | | | |
|---|---|---|---|---|
| 3,936,659 | A | * | 2/1976 | Mainord ............... B08B 7/0085 219/393 |
| 6,768,084 | B2 | * | 7/2004 | Liu ......................... F27D 11/00 118/724 |
| 2003/0082891 | A1 | * | 5/2003 | Walther ............ H01J 37/32412 257/E21.336 |
| 2003/0173347 | A1 | * | 9/2003 | Guiver .............. H01L 21/67017 219/390 |

(Continued)

*Primary Examiner* — Karla A Moore
(74) *Attorney, Agent, or Firm* — Eschweiler & Potashnik, LLC

(57) ABSTRACT

A system, method, and apparatus for heating and cooling a component in chamber enclosing a chamber volume. Vacuum and purge gas ports are in fluid communication with the chamber volume. A heater apparatus selectively heats the heated apparatus to a process temperature. A vacuum valve provides selective fluid communication between a vacuum source and the vacuum port. A purge gas valve provides selective fluid communication between a purge gas source for a purge gas and the purge gas port. A controller controls the heater apparatus, vacuum and purge gas valves and to selectively flow the purge gas to the chamber volume when an equipment-safe temperature is reached. When an operator-safe temperature is reached, access to the chamber volume through an access port by an operator is permitted.

16 Claims, 5 Drawing Sheets

(56) References Cited

U.S. PATENT DOCUMENTS

2007/0251935 A1* 11/2007 Guiver .............. H01L 21/67109
219/390
2015/0004794 A1* 1/2015 Harada ............... H01L 21/6831
438/714

* cited by examiner

METHOD FOR DECREASING COOL DOWN TIME WITH HEATED SYSTEM FOR SEMICONDUCTOR MANUFACTURING EQUIPMENT

FIELD

The present disclosure relates generally to workpiece processing systems and methods for processing workpieces, and more specifically to a system, apparatus, and method for controlling a temperature of a thermal apparatus for reducing downtime of the workpiece processing system.

BACKGROUND

In semiconductor processing, many operations, such as ion implantation, may be performed on a workpiece or semiconductor wafer. As ion implantation processing technology advances, a variety of ion implantation temperatures at the workpiece can be implemented to achieve various implantation characteristics in the workpiece. For example, in conventional ion implantation processing, three temperature regimes are typically considered: cold implants, where process temperatures at the workpiece are maintained at temperatures below room temperature, hot implants, where process temperatures at the workpiece are maintained at high temperatures typically ranging from 100-600° C., and so-called quasi-room temperature implants, where process temperatures at the workpiece are maintained at temperatures slightly elevated above room temperature, but lower than those used in high temperature implants, with quasi-room temperature implant temperatures typically ranging from 50-100° C.

Hot implants, for example, are becoming more common, whereby the process temperature is typically achieved via a dedicated high temperature electrostatic chuck (ESC), also called a heated chuck. The heated chuck holds or clamps the workpiece to a surface thereof during implantation. A conventional high temperature ESC, for example, comprises a set of heaters embedded under the clamping surface for heating the ESC and workpiece to the process temperature (e.g., 100° C.-1500° C.), whereby a gas interface conventionally provides a thermal interface from the clamping surface to the backside of the workpiece. Typically, a high temperature ESC is cooled through radiation of energy to the chamber surfaces in the background.

At times, access to the system is needed for preventive maintenance, general maintenance or various other reasons, whereby the system first needs to be cooled to a safe temperature before access can be granted for handling of the heated chuck. As the heaters associated with the heated chuck are typically situated in a vacuum environment, the period of time taken to cool the heated chuck and heaters (often called a "cool-down time") can be several hours before the heated chuck and heaters are at a safe temperature to be handled. Such extensive cool-down times decrease productivity by increasing the downtime of the system, and further increase maintenance and service times.

SUMMARY

The present disclosure overcomes limitations of the prior art by providing a system, apparatus, and method for reducing a cool-down time of a heated apparatus in a vacuum system. Various aspects of the present disclosure provide advantages over conventional systems and methods, with particular advantages being provided in heated ion implantation systems utilizing a thermal chuck. Accordingly, the following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

In accordance with various aspects of the present disclosure, a system, apparatus, and method are provided to vent an environment associated with a heated apparatus, whereby a gas is introduced to the environment to increase a cooling rate of the heated apparatus, thus shortening a time to cool the heated apparatus to a predetermined temperature. A flow rate and pressure of the gas may be controlled based, at least in part, on one or more of a temperature of the heated apparatus and a power input to one or more heaters of the heated apparatus. The power input to the one or more heated may comprise one or more of a current, voltage, or power applied to the respective one or more heaters of the heated apparatus.

According to one exemplary aspect, a workpiece processing system is provided comprising a chamber generally defining a chamber volume. A purge gas port is provided in fluid communication with the chamber volume, and a purge gas source having a purge gas associated therewith, wherein a purge gas valve is configured to provide selective fluid communication between the purge gas source and the purge gas port. A vacuum port is further provided in fluid communication with the chamber volume along with a vacuum source, wherein a vacuum valve is configured to provide selective fluid communication between the vacuum source and the vacuum port.

In one example, a heated apparatus is positioned within the chamber. A heater apparatus is further provided and configured to selectively heat the heated apparatus to a process temperature based, at least in part, on a power input to the heater apparatus. A temperature sensor, for example, is further provided and configured to determine the temperature of the heated apparatus. The temperature sensor, for example, may comprise one or more of a thermocouple and an RTD.

In accordance with one example of the present disclosure, a controller is also provided and configured to control a cooling of the heated apparatus from a process temperature to a personnel-safe temperature, wherein the control is based, at least in part, on the power input to the heater apparatus, the temperature of the heated apparatus, an equipment-safe temperature that is between the process temperature and the personnel-safe temperature, and an open or closed position of the purge gas valve. In one example, the purge gas valve is closed concurrent with cooling of the heated apparatus from the process temperature to the equipment-safe temperature, wherein the purge gas valve is open concurrent with cooling from the equipment-safe temperature to the personnel-safe temperature. In another example, the controller is further configured to selectively vary a flow of the purge gas from the purge gas port based on the temperature of the heated apparatus.

The controller, for example, is configured to selectively decrease the power input to the heater apparatus from a first power associated with the process temperature to a second power associated with the equipment-safe temperature concurrent with a cooling of the heated apparatus from the process temperature to the equipment-safe temperature. The first power, for example, generally maintains the process temperature of the heated apparatus, and the second power comprises approximately zero power input to the heater apparatus. The controller, for example, is configured to decrease the power input to the heater apparatus from the first power to the second power based, at least in part, on the temperature of the heated apparatus.

In another example, the cooling of the heated apparatus from the process temperature to the equipment-safe temperature is predominantly based on thermal radiation to the chamber, while the cooling of the heated apparatus from the equipment-safe temperature to the personnel-safe temperature is predominantly based on thermal conduction and convection to the purge gas.

The chamber, for example, may further comprise an access port selectively configured in one of a closed position and an open position. In the closed position, for example, the access port generally isolates the chamber volume from an external environment, while in the open position, the access port exposes the chamber volume to the external environment. The controller, for example, is further configured to selectively control an operation of the access port to be in the closed position and open position based, at least in part, on the temperature of the workpiece support.

In one example, a lockout apparatus is provided, wherein the controller is configured to selectively prevent the access port from being configured in the open position via the lockout apparatus when the temperature of the workpiece support is greater than an operator-safe temperature. The access port, for example, may be configured to provide access to an operator to physically contact the heated apparatus within the chamber volume from the external environment when the access port is in the open position.

In another exemplary aspect, the purge gas valve may comprise an automated valve, wherein the controller is configured to open the purge gas valve once the temperature is less than or equal to the equipment-safe temperature, thereby flowing the purge gas into the chamber environment. The controller, for example, may be further configured to selectively vary the flow of the purge gas based on the temperature of the heated apparatus. Alternatively, the purge gas valve may comprise a manual valve, wherein the controller is configured to provide an indicator to an operator that the temperature is less than or equal to the equipment-safe temperature, such that the purge gas valve may be manually opened by the operator upon notification of the indicator.

The process temperature, for example, may range between approximately 200° C. and approximately 1500° C. The equipment-safe temperature, for example, may be approximately 200° C., and the personal-safe temperature may be approximately 60° C.

In yet another exemplary aspect, an ion implantation system is further provided, wherein the chamber comprises one of a load lock chamber and a process chamber, and wherein the heated apparatus comprises a workpiece support configured to selectively support and heat a workpiece. The workpiece support, for example, may comprise an electrostatic chuck.

In accordance with yet another example, the controller may be configured to thermally control the heated apparatus in each of a first mode and a second mode. In the first mode, for example, the controller may be configured to control the heater apparatus, vacuum valve, and the purge gas valve to maintain the heated apparatus at the process temperature in a substantially evacuated environment. In the second mode, for example, the controller may be configured to control the heater apparatus, vacuum valve, and the purge gas valve to cool the heated apparatus from the process temperature to the equipment-safe temperature in the substantially evacuated environment, and to cool the heated apparatus from the equipment-safe temperature to the personnel-safe temperature concurrent with flowing the purge gas into the chamber volume based, at least in part, on the temperature measured by the temperature sensor.

The present disclosure, in accordance with another exemplary aspect, further provides a method for venting an environment in which a heated apparatus is situated. One or more heaters associated with the heated apparatus are powered in a controlled manner, whereby the environment is vented with a gas to increase a cooling rate of the heated apparatus, thus shortening an amount of time taken to cool the heated apparatus to a predetermined temperature, such as a temperature suitable for manual handling of the heated apparatus by an operator. A temperature of the heated apparatus is measured, or otherwise determined, and a power that is input to the one or more heaters, a flow of the gas, and a pressure within the environment are controlled based, at least in part, on a temperature of the heated apparatus and a power input to the heated apparatus.

When the power input to the heated apparatus is halted, for example, the heated apparatus is permitted to cool until a predetermined equipment-safe temperature is reached. The equipment-safe temperature is associated with temperature at which a rate of further cooling of the heated apparatus will not damage the heated apparatus. When the equipment-safe temperature is reached, for example, a gas such as nitrogen ($N_2$) or hydrogen ($H_2$) or other gas is vented into the environment to provide conductive and convective heat transfer from the heated apparatus to the gas, thereby increasing the rate of cooling of the heated apparatus until the personnel-safe temperature is reached.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
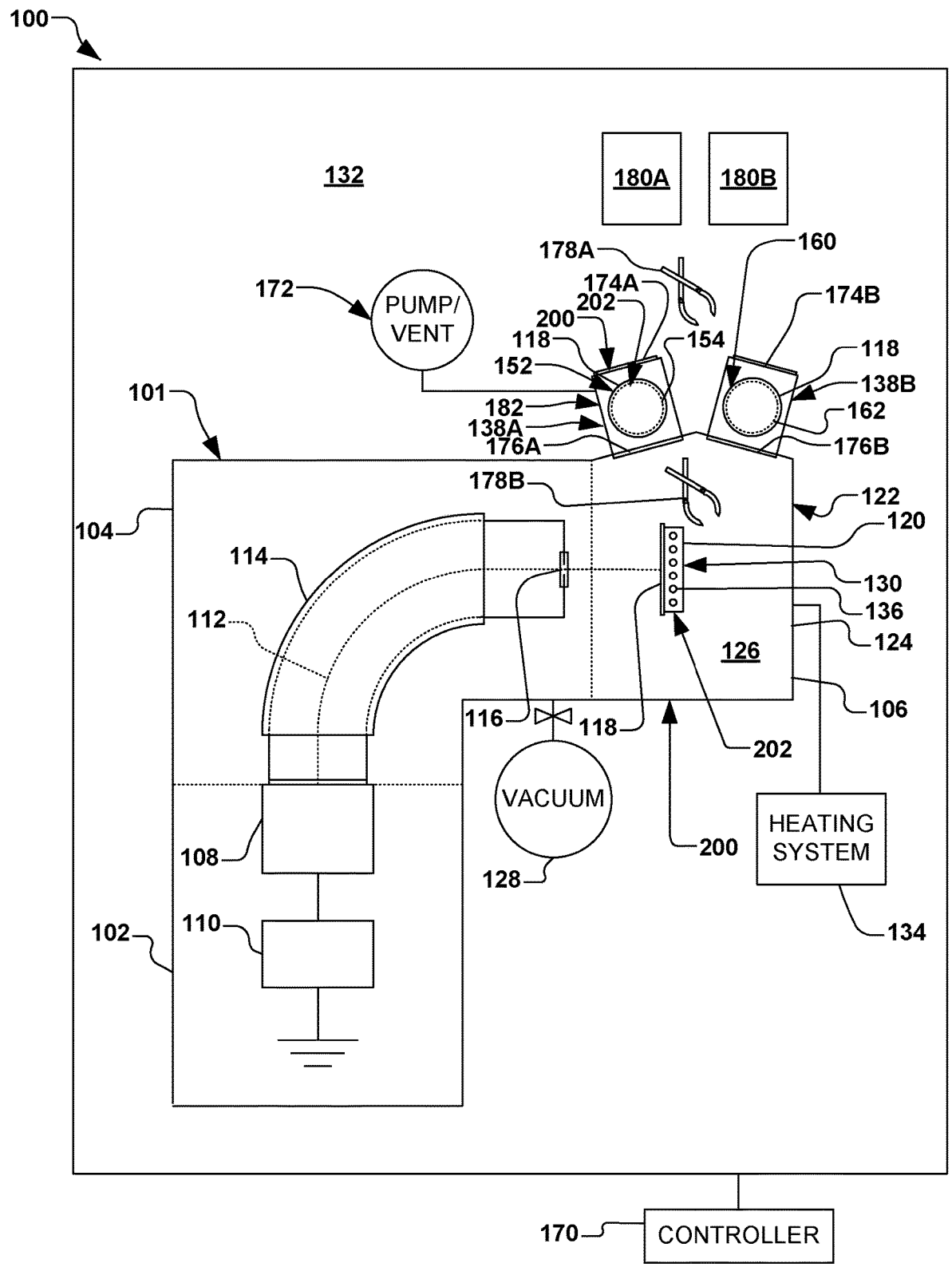
FIG. 1 illustrates a block diagram of an exemplary heated ion implantation system in accordance with an aspect of the present disclosure.

The present disclosure is directed generally toward semiconductor processing systems and methods, and more particularly, to a system and method for controlling a cooling of a heated apparatus in a chamber for a semiconductor processing, such as an ion implantation system.

Accordingly, the present disclosure will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present disclosure. It will be evident to one skilled in the art, however, that the present disclosure may be practiced without these specific details.

Heated ion implantation processes can heat a workpiece to process temperatures in the range of 100° C.-600° C., and in some cases, to 1500° C. or higher. The process temperature, for example, may be achieved and maintained by a workpiece support that supports the workpiece before, during, and/or after implantation, such as an electrostatic chuck.

In order to gain a better understanding of various aspects of the present disclosure, FIG. 1 illustrates an exemplary ion implantation system 100, whereby the ion implantation system may be utilized for such heated ion implantation processes. The ion implantation system 100 in the present example comprises an exemplary ion implantation apparatus 101, however various other types of vacuum-based semiconductor processing systems are also contemplated, such as plasma processing systems, or other semiconductor processing systems. The ion implantation apparatus 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a mass analysis apparatus 114, and out an aperture 116 towards the end station 106. In the end station 106, the ion beam 112 bombards a workpiece 118 (e.g., a substrate such as a silicon wafer, a display panel, etc.), which is selectively clamped or mounted to a thermal chuck 120. The thermal chuck 120, for example, may comprise an electrostatic chuck (ESC) or mechanical clamp chuck, wherein the thermal chuck is configured to selectively control a temperature of the workpiece 118. Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

In one example, the ion implantation apparatus 101 is configured to provide a high temperature ion implantation, wherein the workpiece 118 is heated to a process temperature (e.g., approximately 100-1500° C. or greater). Thus, in the present example, the thermal chuck 120 comprises a heated chuck 130, wherein the heated chuck is configured to support and retain the workpiece 118 while further heating the workpiece 118 within the process chamber 122 prior to, during, and/or after the exposure of the workpiece to the ion beam 112.

The heated chuck 130, for example, comprises an electrostatic chuck (ESC) configured to heat the workpiece 118 to a processing temperature that is considerably greater than an ambient or atmospheric temperature of the surroundings or external environment 132 (e.g., also called an "atmospheric environment"). A heating system 134 may be further provided, wherein the heating system is configured to heat the heated chuck 130 and, in turn, the workpiece 118 residing thereon to the desired processing temperature. The heating system 134, for example, is configured to selectively heat the workpiece 118 via one or more heaters 136 (e.g., resistive heaters) disposed within the heated chuck 130. In one alternative, the heating system 134 comprises a radiant heat source, such as one or more a halogen lamp, light emitting diode, and infrared thermal device configured to selectively heat the workpiece.

For some high temperature implants, the workpiece 118 may allowed to "soak" on the heated chuck 130 within the vacuum of the process environment 126 until the desired temperature is reached. Alternatively, in order to increase cycle time through the ion implantation system 100 the workpiece 118 may be pre-heated in one or more chambers 138A, 138B (e.g., one or more load lock chambers) operatively coupled to the process chamber 122.

Depending on the tool architecture, process, and desired throughput, or other factors, the workpiece 118 may be preheated to a first temperature via a pre-heat apparatus 152 (e.g., a workpiece support, thermal chuck, or other apparatus) disposed within the chamber 138A, for example. The heating system 134 may be further configured to selectively heat the pre-heat apparatus 152 and, in turn, the workpiece 118 residing thereon to the first temperature. In one example, the first temperature is equal to or lower than the process temperature, thus allowing for a final thermal equalization on the heated chuck 130 inside the vacuum chamber 124. Such a scenario allows the workpiece 118 to lose some heat during transfer to the process chamber 122, wherein final heating to the process temperature is performed on the heated chuck 130. Alternatively, the workpiece 118 may be preheated via the pre-heat apparatus 152 to a first temperature that is higher than the process temperature. Accordingly, the first temperature could be optimized such that cooling of the workpiece 118 during transfer to the process chamber 122 allows for the workpiece to be at the desired process temperature as it is clamped onto the heated chuck 130.

In order to accurately control and/or accelerate the thermal response and enable an additional mechanism for heat transfer, the back side of the workpiece 118 may be brought into conductive communication with the heated chuck 130. This conductive communication, for example, is achieved through a pressure controlled gas interface (also called "back side gas") between the heated chuck 130 and the workpiece 118. Pressure of the back side gas, for example, is generally limited by the electrostatic force of the heated chuck 130, and can be generally kept in the range of 5-20 Torr. In one example, the back side gas interface thickness (e.g., the distance between the workpiece 118 and the heated chuck 130) is controlled on the order of microns (typically 5-20 µm), and as such, the molecular mean free path in this pressure regime becomes large enough for the interface thickness to push the system into the transitional and molecular gas regime.

In accordance with another aspect of the disclosure, chamber 138B comprises a cooling apparatus 160 configured to cool the workpiece when the workpiece 118 is disposed within the chamber 138B subsequent to being implanted with ions during ion implantation. The cooling apparatus 160, for example, may comprise a chilled workpiece support 162, wherein the chilled workpiece support is configured to actively cool the workpiece 118 residing thereon via thermal conduction. The chilled workpiece support 162, for example, comprises a cold plate having a one or more cooling channels passing therethrough, wherein a cooling fluid passing through the cooling channel substantially cools the workpiece 118 residing on a surface of the cold plate. The chilled workpiece support 162 may comprise other cooling mechanisms, such as Peltier coolers or other cooling mechanisms known to one of ordinary skill.

In accordance with another exemplary aspect, a controller 170 is further provided and configured to selectively activate one or more of the heating system 134, the pre-heat apparatus 152, and the cooling apparatus to selectively heat or cool the workpiece 118 respectively residing thereon. The controller 170, for example, may be configured to heat the workpiece 118 in chamber 138A via the heating system 134 and the pre-heat apparatus 152, to heat the workpiece to a predetermined temperature in the processing chamber 122 via the heated chuck 130 and heating system 134, to implant ions into the workpiece via the ion implantation apparatus 101, to cool the workpiece in chamber 138B via the cooling apparatus 160, and to selectively transfer the workpiece between the atmospheric environment 132 and the vacuum environment 126 via control of a pump and vent 172, the respective atmospheric doors 174A, 174B and vacuum doors 176A, 176B of the respective chambers 138A, 138B, and workpiece transfer apparatus 178A, 178B.

In one example, the workpiece 118 may be further delivered to and from the process chamber 122 such that the workpiece is transferred between a selected front opening unified pod (FOUP) 180A, 180B and chambers 138A, 138B via workpiece transfer apparatus 178A, and further transferred between the chambers 138A, 138B and the heated chuck 130 via workpiece transfer apparatus 178B. The controller 170, for example, is further configured to selectively transfer the workpiece between the FOUPs 180A, 180B, chambers 138A, 138B, and heated chuck 130 via a control of the workpiece transfer apparatus 178A, 178B.

The present disclosure appreciates that, for various reasons, any of the chambers 138A, 138B and processing chamber 122 may have maintenance performed thereon, whereby an operator may access each of the chambers and/or processing chamber to perform a variety of operations (e.g., preventative maintenance, cleaning, replacement, etc.). In order to safely enter or contact various heated components within any of the chambers 138A, 138B and processing chamber 122, etc., however, a temperature of any heated apparatus (e.g., the pre-heat apparatus 152, heated chuck 130, etc.) disposed therein should be at or below a personnel-safe temperature.

The personnel-safe temperature, for example, is associated with a temperature at which physical contact of the heated apparatus with an operator will not harm the operator. The personnel-safe temperature, for example, may be associated SEMI S2 or ASTM standards, such as ASTM C1055 (e.g., the Standard Guide for Heated System Surface Conditions that Produce Contact Burn Injuries), which recommends that surface temperatures remain at or below 60° C. for safe contact with skin. The reason for this is that the average person can touch a 60° C. surface for up to five seconds without sustaining irreversible burn damage.

Figure 2:
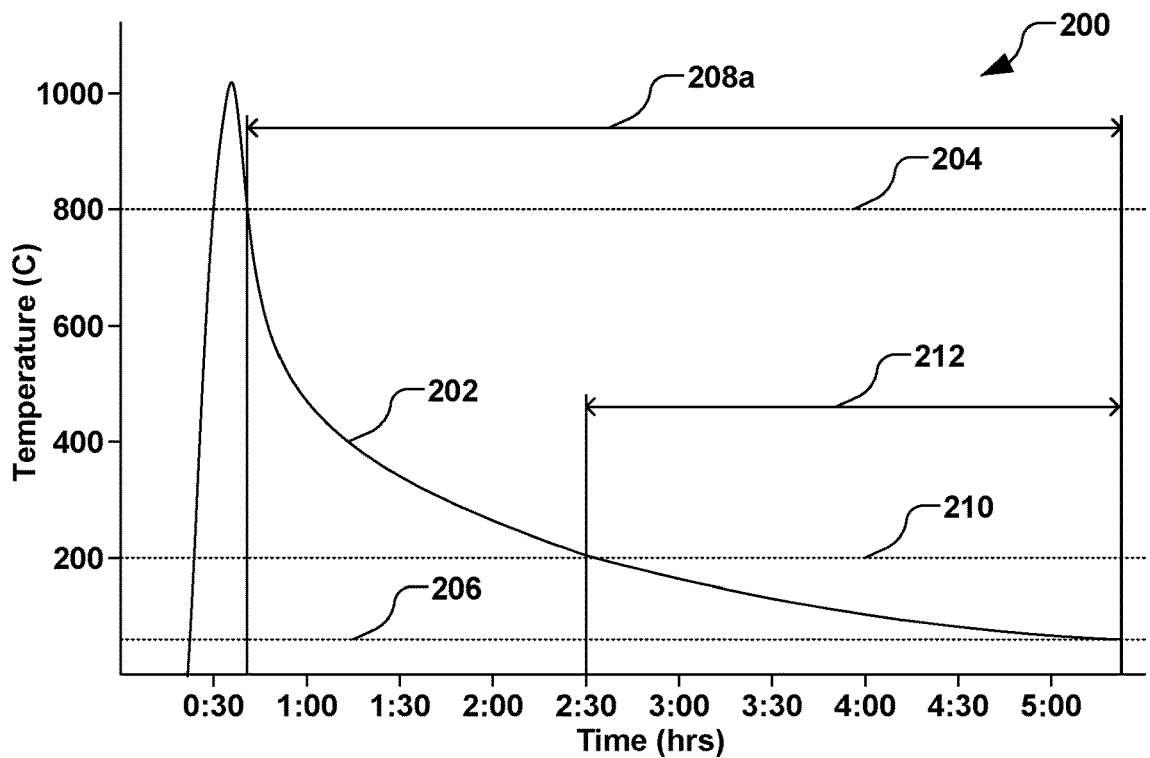
FIG. 2 is a plot of temperature versus time for a cooling of a thermal apparatus in vacuum.

However, the present disclosure appreciates that cooling of the heated apparatus within any of the aforementioned chambers may take a significant period of time when the respective chamber is under vacuum, as heat transfer is mostly a factor of radiation in such a vacuum environment. An example of cooling of a heated apparatus such as the pre-heat apparatus 152 in the vacuum environment 126 of the chamber 138B is illustrated by a plot 200 shown in FIG. 2. As shown by the plot 200, a rate of cooling of the heated apparatus follows a curve 202 from a process temperature 204 (e.g., approximately 800° C.) to a personnel-safe temperature 206 (e.g., 60° C.), whereby an overall cool-down time 208 from the process temperature to the personnel-safe temperature is approximately 4.5 hours when cooled in vacuum.

The present disclosure further appreciates that, while cooling the heated apparatus to the personnel-safe temperature 206 (also called a serviceable temperature) safely permits an operator to physically contact the heated apparatus for maintenance, repair, replacement, etc., the overall cool-down time 208 may adversely affect productivity associated with the heated apparatus within the chamber. The disclosure presently appreciates, however, that the overall cool-down time 208 may be decreased based on an equipment-safe temperature 210 of the heated apparatus within the chamber.

Figure 3:
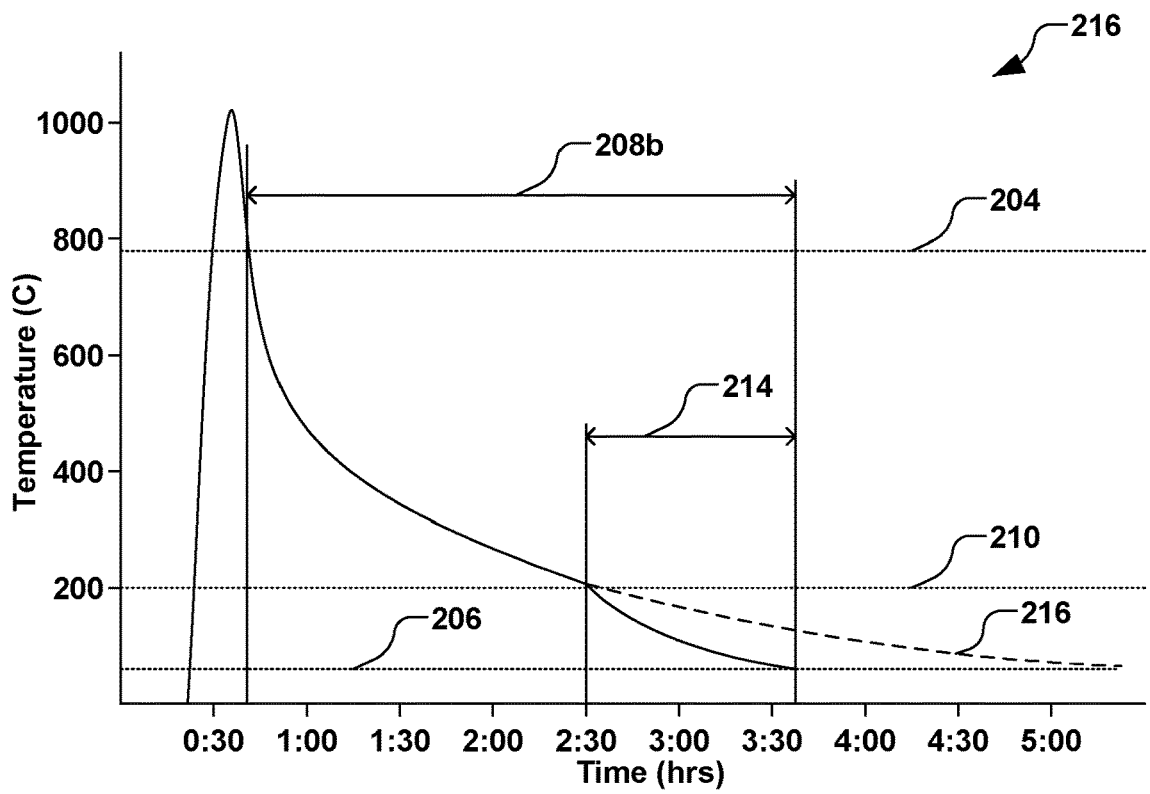
FIG. 3 is a plot of temperature versus time for a cooling of a thermal apparatus in vacuum to an equipment-safe temperature, and in a gaseous environment to a personnel-safe environment.

The equipment-safe temperature 210 of FIG. 3, for example, comprises a temperature between the process temperature 204 and the personnel-safe temperature 206 at which a rate of cooling of the heated apparatus may be increased without deleterious damage occurring to the heated apparatus (e.g., damage or cracking due to thermal shock). For example, a conventional vacuum cool-down time 212 of FIG. 2 may be advantageously shortened to a modified cool-down time 214 in plot 216 of FIG. 3 by the introduction of a purge gas to the chamber of FIG. 1, as will be discussed infra.

In accordance with the present disclosure, in order to safely and expeditiously enter the chamber (e.g., any of the chambers 138A, 138B and processing chamber 122, etc.) and/or contact the heated apparatus (e.g., the pre-heat apparatus 152, heated chuck 130, etc.) within the chamber, the heated apparatus is advantageously cooled from the process temperature 204 (e.g., 800° C.) of FIG. 3 to the personnel-safe temperature 206 (e.g., 60° C.) via an introduction of a purge gas to the chamber (e.g., nitrogen or hydrogen) once the heated apparatus reaches the equipment-safe temperature 210 (e.g., 200° C.). As such, the overall cool-down time 208b of FIG. 3 is decreased compared to the overall cool-down time 208a of FIG. 2, whereby a purge gas cool-down time 214 shown in FIG. 3 reaches the personnel-safe temperature 206 from the equipment-safe temperature 210 in approximately 1 hour and 9 min, whereas the conventional vacuum cool-down time 212 of FIG. 2 with no purge gas reaches the personnel-safe temperature from the equipment-safe temperature in approximately 2 hours and 45 min to complete the same temperature drop (also illustrated in FIG. 3 as dashed line 216). As such, a 58% decrease in overall cool-down time 208 is achieved by introducing the purge gas at the equipment-safe temperature.

Figure 4:
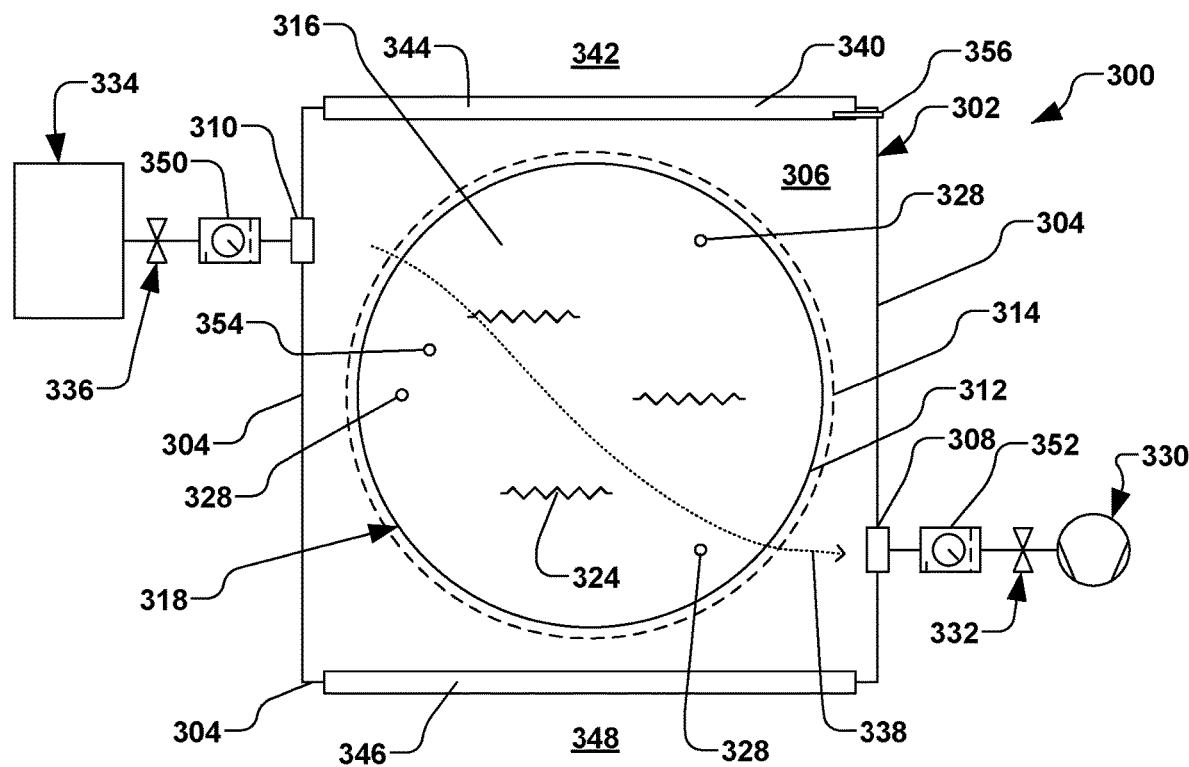
FIG. 4 is a schematic representation of an exemplary chamber in accordance with an aspect of the present disclosure.

In order to accomplish the expeditious cooling of the heated apparatus, as illustrated in FIG. 4, for example, the present disclosure provides an exemplary chamber apparatus 300 (e.g., a loadlock apparatus), wherein a chamber 302, such as the chamber 138A of FIG. 1, is provided. The chamber 302 of FIG. 4, for example, has one or more surfaces 304 generally enclosing a chamber volume 306. The chamber 302, for example, comprises a vacuum port 308 and a purge gas port 310, wherein the vacuum port and purge gas port are in fluid communication with the chamber volume 306. It is to be understood that the chamber 302 may be any chamber utilized in the system 100 of FIG. 1, such as any of the process chamber 106, chambers 138A, 138B, or any selectively evacuated chamber associated with the system 100.

According to one example, a heated apparatus 312 shown in FIG. 4 (e.g., a workpiece support) is positioned within the chamber 302. The heated apparatus 312, for example, is configured to selectively support a workpiece 314 within the chamber. The heated apparatus 312 may thus be any structure or device configured to selectively support the workpiece 314, such as a platen, electrostatic chuck (ESC), or other structure or device. Further, while in the present example, the heated apparatus 312 is described as being a support structure for the workpiece 314, it is to be understood that the heated apparatus 312 may comprise any structure, component, or surface within the chamber 302, regardless of whether the heated apparatus contacts or supports any workpiece.

Figure 5:
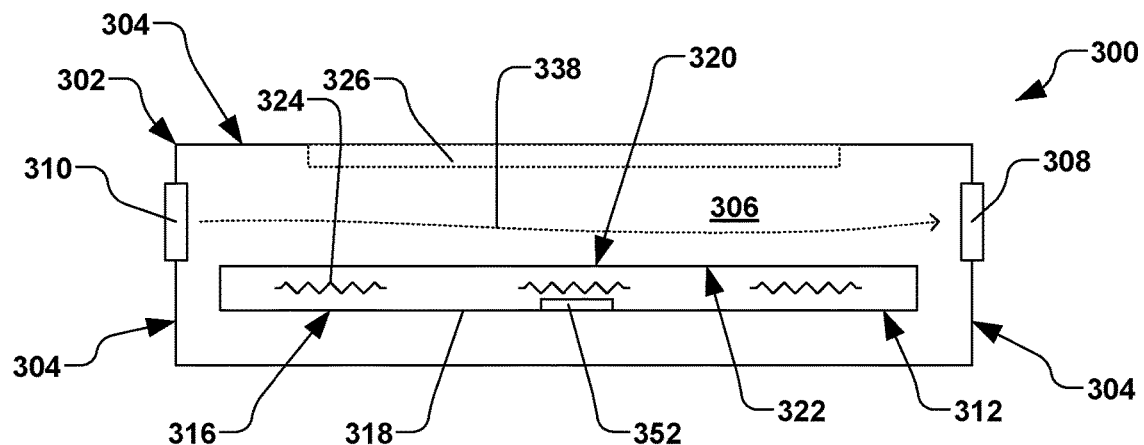
FIG. 5 is a simplified side view of a chamber in accordance with an aspect of the present disclosure.

A heater apparatus 316, for example, is further provided and configured to selectively heat the heated apparatus 312, and in the present example, the workpiece 314, to a process temperature, such as described above. In one example, the heated apparatus 312 comprises a heated platen 318 having a support surface 320 configured to contact a backside 322 of the workpiece 314, as illustrated in FIG. 5. In one example, the heated platen 318 generally defines the heater apparatus 316.

For example, the heater apparatus 316 may comprise one or more resistive heater elements 324 embedded within the heated platen 318, wherein the one or more resistive heater elements are configured to selectively heat the workpiece 314 via thermal conduction through the heated platen. In other examples, the heater apparatus 316 may alternatively, or additionally comprise one or more radiative elements 326, such as a heat lamp, an infrared heater, or other heater element(s). It should be noted that, in some examples, the one or more radiative elements 326 may be omitted, whereby the heated platen 318 is the sole heater apparatus 316. In another example, the heated apparatus 312 may comprise one or more pins 328, as illustrated in FIG. 4, whereby the one or more pins are configured to selectively raise and lower the workpiece 314 onto the support surface 320.

In accordance with the present disclosure, a vacuum source 330 (e.g., a vacuum pump) is provided, wherein a vacuum valve 332 is configured to provide selective fluid communication between the vacuum source and the vacuum port 308. Further, a purge gas source 334 having a purge gas such as an inert gas (e.g., nitrogen gas, $N_2$) or other gas (e.g., hydrogen, $H_2$) is further provided, whereby a purge gas valve 336 is configured to provide selective fluid communication between the purge gas source and the purge gas port 310.

In accordance with one example, the controller (e.g., the controller 170 of FIG. 1) is further configured to control the vacuum valve 330 and purge gas valve 336 of the chamber apparatus 300 of FIG. 4 to selectively flow the purge gas from the purge gas port 310 to the chamber volume 306 and/or to the vacuum port 308 at one or more of a predetermined pressure and predetermined flow rate. The flow of the purge gas from the purge gas port 310 to the chamber volume 306, for example, may be concurrent with the selective heating of the heated apparatus 312 by the heater apparatus 316, or subsequent to the heater apparatus halting the heating of the heated apparatus. In one example, the vacuum valve 330 is closed while the purge gas valve 336 is opened, thus pressurizing the chamber volume 306 to the predetermined pressure. Accordingly, expeditious cooling of the heated apparatus 312 may be advantageously achieved via one or more of conduction and convection through the purge gas. In another example, the vacuum port 308 and purge gas port 310 are generally positioned opposite one another with respect to the chamber 302, whereby a flow (shown by arrow 338) generally passes over the heated apparatus 312, thus further advantageously cooling the heated apparatus.

In one example, the chamber 302 is generally evacuated by the vacuum source 330 while the purge gas is concurrently introduced into the chamber from the purge gas source 334 wherein the predetermined pressure is advantageously maintained within the chamber volume 306. For example, the predetermined pressure is approximately atmospheric pressure, whereby an advantageous heat transfer can be achieved cooling the heated apparatus 312.

According to another example, as illustrated in FIG. 4, an access port 340 is operably coupled to the chamber and configured to provide selective fluid communication between the chamber volume 306 and a first environment 342, such as the external environment 132 of FIG. 1. The access port 340, in one example, is selectively configured in one of a closed position and an open position, wherein in the closed position, the access port generally isolates the chamber volume 306 from the external environment 132 of FIG. 1. In the open position, the access port 342 of FIG. 4, for example, exposes the chamber volume 306 to the external environment 132 of FIG. 1, wherein the controller 170 is further configured to selectively control an operation of the access port to be in the closed position and open position. The access port 340, for example, may comprise a first loadlock valve 344 shown in FIG. 4, wherein the first loadlock valve is further configured to selectively pass the workpiece 314 between the chamber volume 306 and the first environment 342, as discussed above.

The access port 340, for example, may be further configured to permit an operator to selectively access the chamber volume 306, as will be discussed further, infra. While the access port 340 is described in one example as the first loadlock valve 344, it should be understood that the access port may be any valve, port, or access way configured to permit access to the chamber 302 to the heated apparatus 312 in the chamber volume 306, such as by an operator.

In the present example, a second loadlock valve 346 is further operably coupled to the chamber 302 and configured to provide selective fluid communication between the chamber volume 306 and a second environment 348 (e.g., a vacuum environment such as the process environment 126 of FIG. 1). The second loadlock valve 346 of FIG. 4, for example, is further configured to selectively pass the workpiece 314 between the chamber volume 306 and second environment 348.

The controller 170 of FIG. 1, for example, is further configured to selectively open and close the access port 340 of FIG. 4, thereby selectively isolating the chamber volume 306 from the first environment 342. In a further example, the controller 170 of FIG. 1 is further configured to selectively open and close the second loadlock valve 346, thereby selectively isolating the chamber volume 306 from the second environment 348. The controller 170 of FIG. 1, for example, may be further configured to flow the purge gas from the purge gas port 310 of FIG. 4 to chamber volume 306 concurrent with one or more of the second loadlock valve 346 isolating the chamber volume 306 from the second environment 348 and the first loadlock valve 344 isolating the chamber volume from the first environment 342. The controller 170 of FIG. 1 may be further configured open the purge gas valve 336 and optionally, the vacuum valve 332 of FIG. 4, concurrent with the heating of the heated apparatus 312 by the heater apparatus 316, thereby further concurrently flowing the purge gas from the purge gas port 310 to the chamber volume 306 and optionally, the vacuum port 308, at the predetermined pressure.

In accordance with another example, the purge gas valve 336 may further comprise a purge gas regulator 350. Additionally, or optionally, the vacuum valve 332 may further comprise a vacuum regulator 352. As such, the purge gas regulator 350 and vacuum regulator 352, for example, may be configured to provide the predetermined pressure and flow rate when the purge gas is flowed from the purge gas port 310 to the vacuum port 308. In accordance with another example, the controller 170 of FIG. 1 may be further configured to control one or more of the purge gas regulator 350 and vacuum regulator 352 of FIG. 4, thereby controlling the predetermined pressure and flow rate. Alternatively, one or more of the purge gas regulator 350 and vacuum regulator 352 may comprise manual regulators, whereby the pressure associated therewith may be manually controlled. In still another example, one or more of the purge gas valve 336 and vacuum valve 332 may comprise manual valves that may be controlled by an operator.

In accordance with yet another example, a temperature measurement apparatus 354 (e.g., a thermocouple, RTD, or other device operable to measure temperature) may be provided and configured to determine or define a measured temperature of the heated apparatus 312. Accordingly, the controller 170 of FIG. 1 may be further configured to control the vacuum valve 332 and purge gas valve 336 of FIG. 4 based, at least in part, on the measured temperature of the heated apparatus 312. In yet another example, the controller 170 of FIG. 1 is further configured to control the vacuum valve 332 and purge gas valve 336 based, at least in part, on a predetermined time after halting a heating of the heated apparatus 312 by the heater apparatus 316.

According to another example, a lockout apparatus 356 is further provided and configured to selectively prevent access to the chamber volume 306. For example, the controller 170 of FIG. 1 is configured to selectively prevent the access port 340 from being configured in the open position via the lockout apparatus 356 when the temperature of the heated apparatus 312 is greater than an operator-safe temperature (e.g., 60 C). For example, the access port 340 is configured to provide access to an operator to physically contact the heated apparatus 312 within the chamber volume 306 from the external environment 342 when the access port is in the open position. Such control may be automatic via the controller 170 of FIG. 1 controlling an automated opening and closing of the access port 340 of FIG. 4. Alternatively, the control of the access port 340 may be via the lockout apparatus 356, whereby manual opening and closing of the access port is controlled based on a position or actuation of the lockout apparatus. In yet another alternative, the controller 170 of FIG. 1 may be configured to provide an indicator to the operator that the temperature is less than or equal to the equipment-safe temperature, whereby the operator may manually open the access port upon reaching the equipment-safe temperature.

The present disclosure thus advantageously provides an efficient solution to minimizing a duration of time associated with cooling of the heated apparatus 312, while providing a safe working environment for the operator. For example, the heated apparatus 312 may be operated in vacuum in the chamber environment 306 at the process temperature 204 of FIG. 3, such as during ion implantation or other processing being performed on various workpieces. Operating the heated apparatus 312 of FIG. 4 at the process temperature, for example, may comprise evacuating the chamber 302 to a vacuum pressure (e.g., approximately 10 Torr) via the vacuum pump 330, with the vacuum valve 332 open, while heating the heated apparatus 312 via the heater apparatus 316 to temperatures up to approximately 1500 C.

Upon determining that maintenance is needed, or access to the chamber environment 306 by an operator is otherwise desired, for example, the heater apparatus 316 of FIG. 4 may be controlled (e.g., by the controller 170 of FIG. 1) to gradually, incrementally, or entirely halt heating of the headed apparatus 314 such as by controlling a power input to the one or more heater elements 324. It is to be understood that the control of the power input to the one or more heater elements 324 may comprise a control of one or more of a current, voltage, and/or power applied to any of the respective one or more heater elements. As such, cooling of the heated apparatus 312 of FIG. 4 can transpire via thermal radiation from the heated apparatus, until the heated apparatus reaches the equipment-safe temperature 210 of FIG. 3. Once the temperature measured by the temperature measurement apparatus 354 reaches the equipment-safe temperature, for example, the vacuum valve 332 may be closed or otherwise controlled, and the purge gas valve 336 may be opened or otherwise controlled to introduce the purge gas to the chamber volume 306, whereby cooling of the heated apparatus 312 may be advantageously increased via thermal conduction and/or convection. Once the temperature measured by the temperature measurement apparatus 354 is less than or equal to the personnel-safe temperature, the access port 340 may be opened, thus providing safe access to the heated apparatus 314 within the chamber volume 306.

In another aspect of the disclosure, FIG. 5 illustrates a method 300 for controlling a cooling rate of a heated apparatus in a workpiece processing system. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

Figure 6:
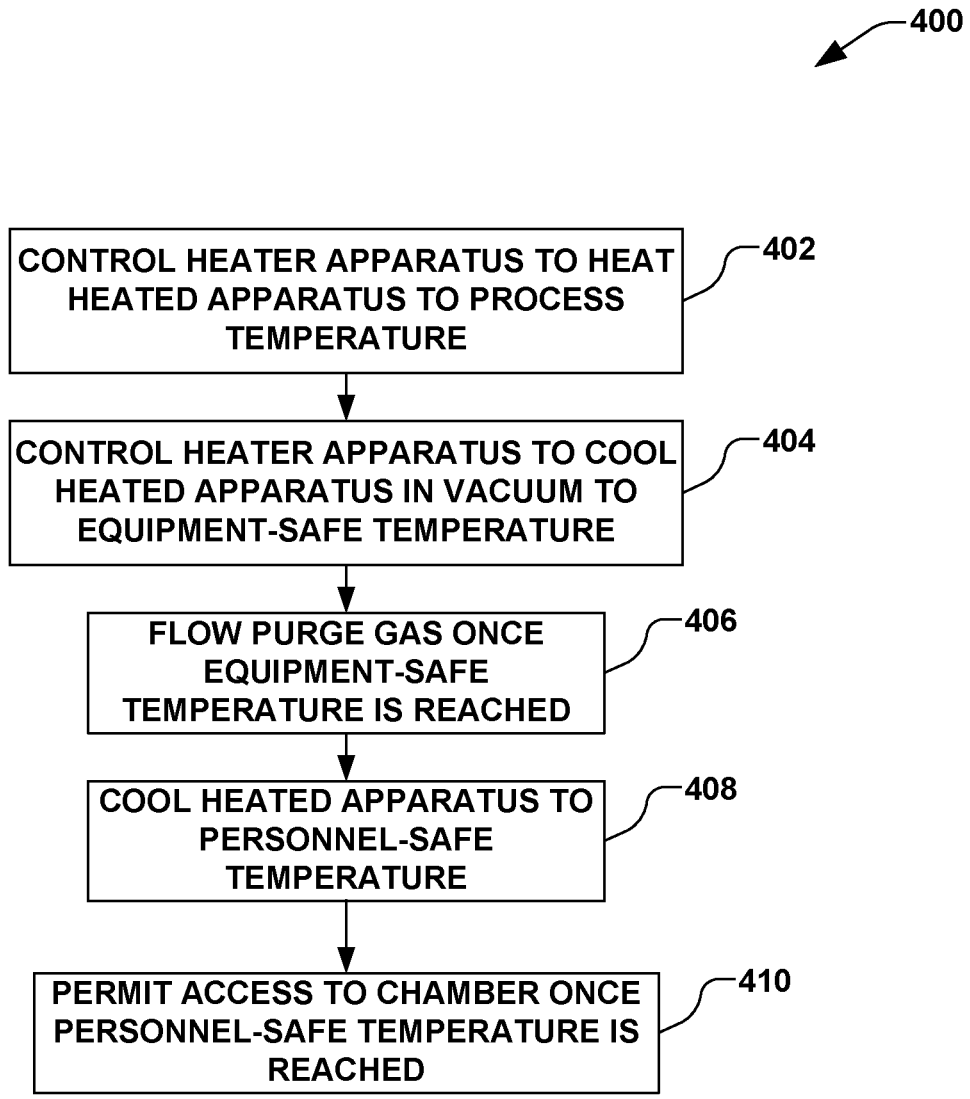
FIG. 6 is a block diagram illustrating an exemplary method for safely cooling a thermal apparatus according to another exemplary aspect of the disclosure.

The method 400 shown in FIG. 6, for example, comprises heating the heated apparatus via a heater apparatus in a chamber to a process temperature under vacuum in act 402. In act 404, the heater apparatus is controlled (e.g., power is removed or decreased) to selectively cool the heated apparatus from the process temperature to an equipment-safe temperature. In act 406, a purge gas is flowed within the chamber volume at a predetermined pressure once the heated apparatus reaches an equipment-safe temperature. Further, in act 408, the heated apparatus is cooled by conduction and/or convention concurrent with the flowing of the purge gas, whereby the heated apparatus is cooled to a personnel-safe temperature. Once the personnel-safe temperature is reached, access to the chamber is permitted in act 410.

Figure 7:
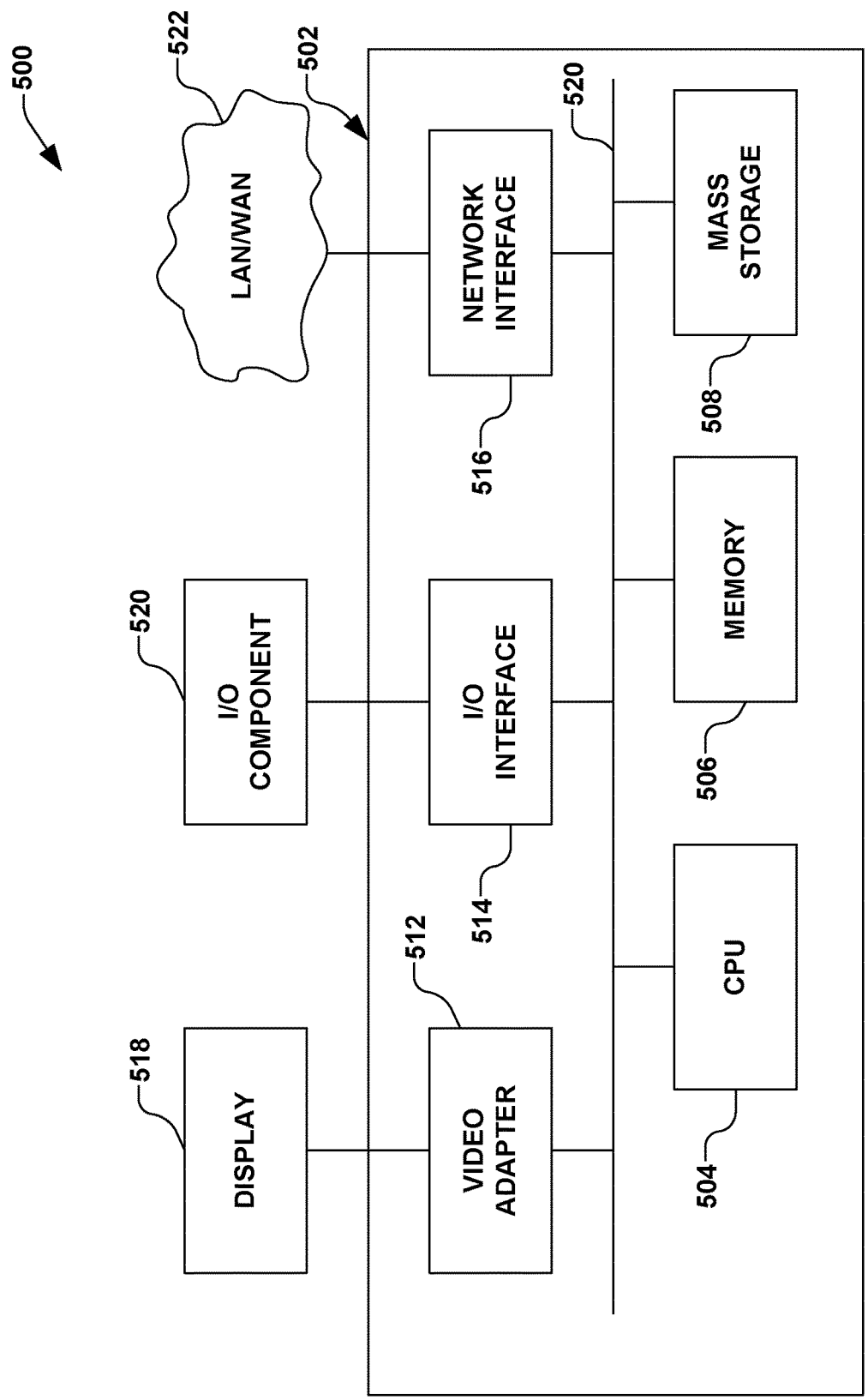
FIG. 7 is a block diagram illustrating an exemplary control system in accordance with another aspect.

In accordance with another aspect, the aforementioned methodology may be implemented using computer program code in one or more of a controller, general purpose computer, or processor based system. As illustrated in FIG. 7, a block diagram is provided of a processor based system 500 in accordance with another embodiment. The processor based system 500 is a general purpose computer platform and may be used to implement processes discussed herein. The processor based system 500 may include a processing unit 502, such as a desktop computer, a workstation, a laptop computer, or a dedicated unit customized for a particular application. The processor based system 500 may be equipped with a display 504 and one or more input/output devices 506, such as a mouse, a keyboard, or printer. The processing unit 502 may include a central processing unit (CPU) 508, memory 510, a mass storage device 512, a video adapter 514, and an I/O interface 516 connected to a bus 518.

The bus 518 may be one or more of any type of several bus architectures including a memory bus or memory controller, a peripheral bus, or video bus. The CPU 508 may include any type of electronic data processor, and the memory 510 may include any type of system memory, such as static random access memory (SRAM), dynamic random access memory (DRAM), or read-only memory (ROM).

The mass storage device 512 may include any type of storage device configured to store data, programs, and other information and to make the data, programs, and other information accessible via the bus 518. The mass storage device 512 may include, for example, one or more of a hard disk drive, a magnetic disk drive, or an optical disk drive.

The video adapter 520 and the I/O interface 522 provide interfaces to couple external input and output devices to the processing unit 502. Examples of input and output devices include the display 504 coupled to the video adapter 520 and the I/O device 506, such as a mouse, printer, and the like, coupled to the I/O interface 522. Other devices may be coupled to the processing unit 502, and additional or fewer interface cards may be utilized. For example, a serial interface card (not shown) may be used to provide a serial interface for a printer. The processing unit 502 also may include a network interface 524 that may be a wired link to a local area network (LAN) or a wide area network (WAN) 526 and/or a wireless link.

It should be noted that the processor based system 500 may include other components. For example, the processor based system 500 may include power supplies, cables, a motherboard, removable storage media, cases, and the like. These other components, although not shown, are considered part of the processor based system 500.

Embodiments of the present disclosure may be implemented on the processor based system 500, such as by program code executed by the CPU 508. Various methods according to the above-described embodiments may be implemented by program code. Accordingly, explicit discussion herein is omitted.

Further, it should be noted that various modules and devices in the Figures may be implemented on and controlled by one or more processor based systems 500 of FIG. 7. Communication between the different modules and devices may vary depending upon how the modules are implemented. If the modules are implemented on one processor based system 500, data may be saved in memory 510 or mass storage 512 between the execution of program code for different steps by the CPU 508. The data may then be provided by the CPU 508 accessing the memory 510 or mass storage 512 via bus 518 during the execution of a respective step. If modules are implemented on different processor based systems 500 or if data is to be provided from another storage system, such as a separate database, data can be provided between the systems 500 through I/O interface 522 or network interface 524. Similarly, data provided by the devices or stages may be input into one or more processor based system 500 by the I/O interface 522 or network interface 524. A person having ordinary skill in the art will readily understand other variations and modifications in implementing systems and methods that are contemplated within the scope of varying embodiments.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. A workpiece processing system, comprising:
a chamber generally defining a chamber volume;
a purge gas port in fluid communication with the chamber volume;
a purge gas source having a purge gas associated therewith;
a purge gas valve configured to provide selective fluid communication between the purge gas source and the purge gas port;
a vacuum port in fluid communication with the chamber volume;
a vacuum source;
a vacuum valve configured to provide selective fluid communication between the vacuum source and the vacuum port;
a heated apparatus positioned within the chamber;

a heater apparatus configured to selectively heat the heated apparatus to a process temperature based, at least in part, on a power input to the heater apparatus;

a temperature sensor configured to determine a temperature of the heated apparatus; and a controller configured to control a cooling of the heated apparatus from a process temperature to a personnel-safe temperature, wherein the control is at least based on the power input to the heater apparatus, the temperature of the heated apparatus, and an equipment-safe temperature that is between the process temperature and the personnel-safe temperature, wherein the controller is configured to increase a rate of the cooling of the heated apparatus from the equipment-safe temperature to the personnel-safe temperature based on a position of the purge gas valve, wherein the controller is configured to control the purge gas valve to be closed concurrent with cooling of the heated apparatus from the process temperature to the equipment-safe temperature, and wherein the controller is configured to control the purge gas valve to be open concurrent with cooling from the equipment-safe temperature to the personnel-safe temperature.

2. The workpiece processing system of claim 1, wherein the controller is configured to selectively decrease the power input to the heater apparatus from a first power associated with the process temperature to a second power associated with the equipment-safe temperature concurrent with the cooling of the heated apparatus from the process temperature to the equipment-safe temperature.

3. The workpiece processing system of claim 2, wherein the first power generally maintains the process temperature of the heated apparatus, and wherein the second power comprises approximately zero power input to the heater apparatus.

4. The workpiece processing system of claim 2, wherein the controller is configured to decrease of the power input to the heater apparatus from the first power to the second power based, at least in part, on the temperature of the heated apparatus.

5. The workpiece processing system of claim 2, wherein the cooling of the heated apparatus from the process temperature to the equipment-safe temperature is predominantly based on thermal radiation to the chamber, and wherein the cooling of the heated apparatus from the equipment-safe temperature to the personnel-safe temperature is predominantly based on thermal conduction and convection to the purge gas.

6. The workpiece processing system of claim 1, wherein the chamber further comprises an access port selectively configured in one of a closed position and an open position, wherein in the closed position, the access port generally isolates the chamber volume from an external environment, and wherein in the open position, the access port exposes the chamber volume to the external environment, wherein the controller is further configured to selectively control an operation of the access port to be in the closed position and open position based, at least in part, on the temperature of a workpiece support.

7. The workpiece processing system of claim 6, further comprising a lockout apparatus, wherein the controller is configured to selectively prevent the access port from being configured in the open position via the lockout apparatus when the temperature of the workpiece support is greater than an operator-safe temperature.

8. The workpiece processing system of claim 6, wherein the access port is configured to provide access to an operator to physically contact the heated apparatus within the chamber volume from the external environment when the access port is in the open position.

9. The workpiece processing system of claim 1, wherein the purge gas valve comprises an automated valve, wherein the controller is configured to open the purge gas valve once the temperature is less than or equal to the equipment-safe temperature, thereby flowing the purge gas into the chamber volume.

10. The workpiece processing system of claim 9, wherein the controller is further configured to selectively vary the flow of the purge gas based on the temperature of the heated apparatus.

11. The workpiece processing system of claim 1, wherein the purge gas valve comprises a manual valve, wherein the controller is configured to provide an indicator to an operator that the temperature is less than or equal to the equipment-safe temperature.

12. The workpiece processing system of claim 1, wherein the process temperature ranges between approximately 200 C and approximately 1500 C, wherein the equipment-safe temperature is approximately 200 C, and wherein the personal-safe temperature is approximately 60 C.

13. The workpiece processing system of claim 1, further comprising an ion implantation system, wherein the chamber comprises one of a load lock chamber and a process chamber, and wherein the heated apparatus comprises a workpiece support configured to selectively support and heat a workpiece.

14. The workpiece processing system of claim 13, wherein the workpiece support comprises an electrostatic chuck.

15. The workpiece processing system of claim 1, wherein the temperature sensor comprises one or more of a thermocouple and an RTD.

16. The workpiece processing system of claim 1, wherein the controller is further configured to selectively vary a flow of the purge gas from the purge gas port based on the temperature of the heated apparatus.

* * * * *